United States Patent
Shimizu et al.

(10) Patent No.: US 10,490,730 B2
(45) Date of Patent: Nov. 26, 2019

(54) MAGNETIC MEMORY DEVICE WITH INCREASED STORAGE DENSITY

(71) Applicant: Kabushiki Kaisha Toshiba, Minato-ku (JP)

(72) Inventors: Mariko Shimizu, Nerima (JP); Yuichi Ohsawa, Yokohama (JP); Hideyuki Sugiyama, Kawasaki (JP); Satoshi Shirotori, Yokohama (JP); Altansargai Buyandalai, Kawasaki (JP); Hiroaki Yoda, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/905,915

(22) Filed: Feb. 27, 2018

(65) Prior Publication Data

US 2019/0088859 A1   Mar. 21, 2019

(30) Foreign Application Priority Data

Sep. 20, 2017   (JP) .................................. 2017-179782

(51) Int. Cl.
*H01L 43/02*   (2006.01)
*H01L 43/08*   (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC combination set(s) only.
See application file for complete search history.

(56) References Cited

U.S. PATENT DOCUMENTS 10,141,037 B2 * 11/2018 Ohsawa ................ H01L 27/222
2004/0188732 A1    9/2004 Fukuzumi
(Continued)

FOREIGN PATENT DOCUMENTS

JP    2004-349671 A    12/2004
JP    2006-060207       3/2006
(Continued)

*Primary Examiner* — David Lam
(74) *Attorney, Agent, or Firm* — Oblon, McClelland, Maier & Neustadt, L.L.P.

(57) ABSTRACT

According to one embodiment, a magnetic memory device includes a conductive layer, first and second magnetic layers, a first nonmagnetic layer and a controller. The conductive layer includes first and second portions, and a third portion between the first and second portions. The first magnetic layer is separated from the third portion in a first direction crossing a second direction being from the first portion toward the second portion. The second magnetic layer is provided between the first magnetic layer and at least a portion of the third portion. The first nonmagnetic layer includes first and second regions. The first region is provided between the first and second magnetic layers. The second region is continuous with the first region. The second region overlaps at least a portion of the second magnetic layer in the second direction. The controller is electrically connected to the first and second portions.

15 Claims, 11 Drawing Sheets

(51) Int. Cl.
*G11C 11/16* (2006.01)
*H01L 43/10* (2006.01)
*H01L 27/22* (2006.01)
*H01L 43/12* (2006.01)
*H01L 43/06* (2006.01)

(52) U.S. Cl.
CPC .......... *H01L 27/222* (2013.01); *H01L 27/228* (2013.01); *H01L 43/06* (2013.01); *H01L 43/08* (2013.01); *H01L 43/10* (2013.01); *H01L 43/12* (2013.01); *G11C 11/1673* (2013.01)

(56) References Cited

U.S. PATENT DOCUMENTS

| | | |
|---|---|---|
| 2006/0028865 A1 | 2/2006 | Kim et al. |
| 2016/0197268 A1 | 7/2016 | Yakabe et al. |
| 2017/0076769 A1 | 3/2017 | Shirotori et al. |
| 2018/0040357 A1 | 2/2018 | Shirotori et al. |
| 2018/0159024 A1* | 6/2018 | Buyandalai ............ H01L 43/02 |
| 2018/0277185 A1 | 9/2018 | Shimizu et al. |

FOREIGN PATENT DOCUMENTS

| | | |
|---|---|---|
| JP | 2013-197413 | 9/2013 |
| JP | 2015-179694 | 10/2015 |
| JP | 2017-59594 A | 3/2017 |
| JP | 2018-022806 | 2/2018 |
| JP | 6283437 | 2/2018 |
| WO | WO 2015/141673 A1 | 9/2015 |

\* cited by examiner

MAGNETIC MEMORY DEVICE WITH INCREASED STORAGE DENSITY

CROSS-REFERENCE TO RELATED APPLICATIONS

This application is based upon and claims the benefit of priority from Japanese Patent Application No.2017-179782, filed on Sep. 20, 2017; the entire contents of which are incorporated herein by reference.

FIELD

Embodiments described herein relate generally to a magnetic memory device.

BACKGROUND

It is desirable to increase the storage density of a magnetic memory device.

DETAILED DESCRIPTION

Figure 1A:
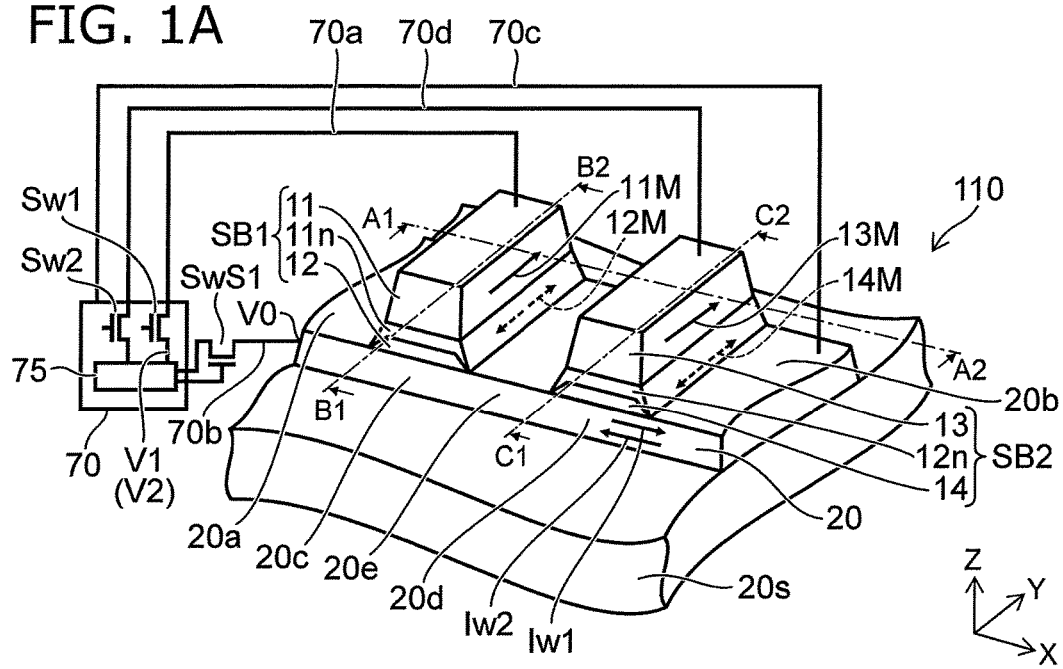
FIG. 1A to FIG. 1D are schematic views illustrating a magnetic memory device according to a first embodiment.

According to one embodiment, a magnetic memory device includes a conductive layer, a first magnetic layer, a second magnetic layer, a first nonmagnetic layer and a controller. The conductive layer includes a first portion, a second portion, and a third portion between the first portion and the second portion. The conductive layer includes a first metal. The first magnetic layer is separated from the third portion in a first direction crossing a second direction. The second direction is from the first portion toward the second portion. The second magnetic layer is provided between the first magnetic layer and at least a portion of the third portion. The first nonmagnetic layer includes a first region and a second region. The first region is provided between the first magnetic layer and the second magnetic layer. The second region is continuous with the first region. The second region overlaps at least a portion of the second magnetic layer in the second direction. The controller is electrically connected to the first portion and the second portion. The controller is configured to supply a current to the conductive layer.

According to another embodiment, a magnetic memory device includes a conductive layer, a first magnetic layer, a second magnetic layer, a first nonmagnetic layer, a second region, a first insulating region and a controller. The conductive layer includes a first portion, a second portion, and a third portion between the first portion and the second portion, the conductive layer including a first metal. The first magnetic layer is separated from the third portion in a first direction crossing a second direction. The second direction is from the first portion toward the second portion. The second magnetic layer is provided between the first magnetic layer and at least a portion of the third portion. The first nonmagnetic layer includes a first region, the first nonmagnetic layer including Mg and at least one selected from the group consisting of oxygen and nitrogen. The first region is provided between the first magnetic layer and the second magnetic layer. The second region includes Mg and at least one selected from the group consisting of oxygen and nitrogen. The second region overlaps at least a portion of the second magnetic layer in the second direction. The first insulating region includes at least one selected from the group consisting of Si and Al and including at least one selected from the group consisting of oxygen and nitrogen. A direction from the first insulating region toward the second magnetic layer is aligned with a third direction crossing a plane including the first direction and the second direction. The controller is electrically connected to the first portion and the second portion. The controller is configured to supply a current to the conductive layer.

According to another embodiment, a magnetic memory device includes a conductive layer, a first magnetic layer, a second magnetic layer, a first nonmagnetic layer, a second region, a first insulating region and a controller. The conductive layer includes a first portion, a second portion, and a third portion between the first portion and the second portion, the conductive layer including a first metal. The first magnetic layer is separated from the third portion in a first direction crossing a second direction. The second direction is from the first portion toward the second portion. The second magnetic layer is provided between the first magnetic layer and at least a portion of the third portion. The first nonmagnetic layer includes a first region provided between the first magnetic layer and the second magnetic layer. The second region overlaps at least a portion of the second magnetic layer in the second direction. A direction from the first insulating region toward the second magnetic layer is aligned with a third direction crossing a plane including the first direction and the second direction. The controller is electrically connected to the first portion and the second portion. The controller is configured to supply a current to the conductive layer. An absolute value of a difference between a linear expansion coefficient of the second region and a linear expansion coefficient of the second magnetic layer is less than an absolute value of a difference between a linear expansion coefficient of the first insulating region and the linear expansion coefficient of the second magnetic layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment.

Figure 1B:
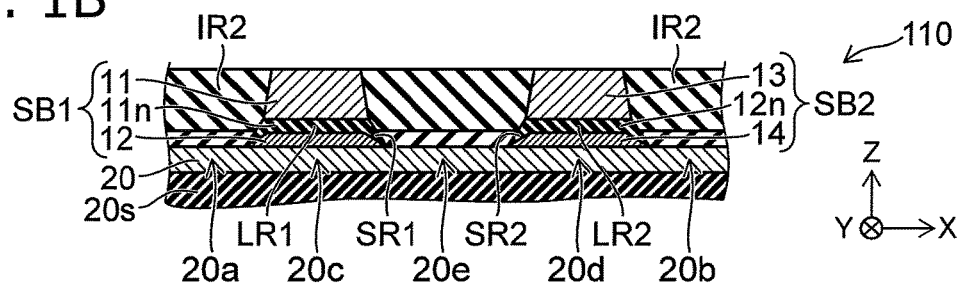
Figure 1C:
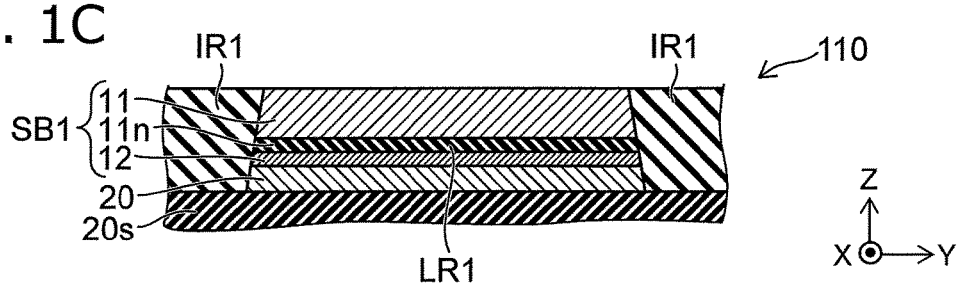
Figure 1D:
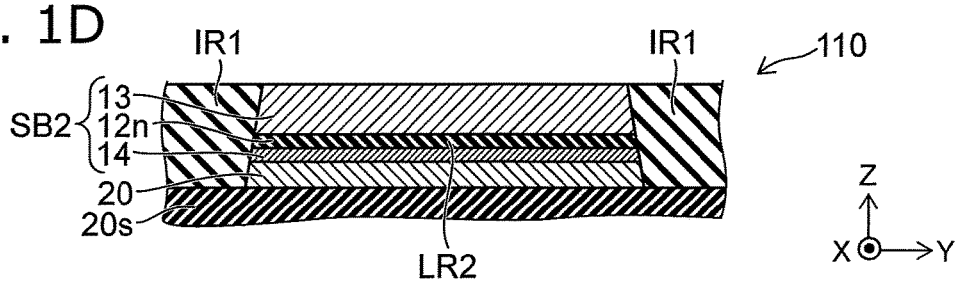

FIG. 1A is a perspective view. FIG. 1B is a line A1-A2 cross-sectional view of FIG. 1A. FIG. 1C is a line B1-B2 cross-sectional view of FIG. 1A. FIG. 1D is a line C1-C2 cross-sectional view of FIG. 1A. A portion of the components illustrated in FIG. 1B to FIG. 1D is not illustrated in FIG. 1A.

As shown in FIG. 1A to FIG. 1D, the magnetic memory device 110 according to the embodiment includes a conductive layer 20, a first magnetic layer 11, a second magnetic layer 12, a first nonmagnetic layer 11n, and a controller 70. A base body 20s, a third magnetic layer 13, a fourth magnetic layer 14, and a second nonmagnetic layer 12n are further provided in the example.

The first magnetic layer 11, the second magnetic layer 12, and the first nonmagnetic layer 11n are included in a first stacked body SB1. The third magnetic layer 13, the fourth magnetic layer 14, and the second nonmagnetic layer 12n are included in a second stacked body SB2. Each of these stacked bodies corresponds to one memory portion (memory cell). Thus, multiple stacked bodies are provided in the magnetic memory device 110. The number of stacked bodies is arbitrary.

The conductive layer 20 is provided on the base body 20s. The stacked bodies recited above are provided on the conductive layer 20. The base body 20s may be at least a portion of a substrate. The base body 20s is, for example, insulative. The base body 20s may include, for example, a substrate including at least one of silicon oxide or aluminum oxide, etc. The silicon oxide is, for example, thermally-oxidized silicon. The conductive layer 20 is nonmagnetic.

The conductive layer 20 includes a first metal. The first metal includes, for example, at least one selected from the group consisting of Ta, W, Re, Os, Ir, Pt, Pd, Cu, and Ag. The conductive layer 20 may further include another element in addition to the first metal. The other element includes, for example, at least one selected from the group consisting of B, Mg, Al, Si, Hf, Ti, and Zr.

The conductive layer 20 includes, for example, first to fifth portions 20a to 20e. The third portion 20c is positioned between the first portion 20a and the second portion 20b. The fourth portion 20d is positioned between the third portion 20c and the second portion 20b. The fifth portion 20e is positioned between the third portion 20c and the fourth portion 20d.

The first stacked body SB1 is provided on the third portion 20c. The second stacked body SB2 is provided on the fourth portion 20d. The stacked bodies are not provided on the fifth portion 20e. An insulating region described below, etc., are provided on the fifth portion 20e.

The first magnetic layer 11 is separated from the third portion 20c along a first direction.

The first direction is taken as a Z-axis direction. One axis perpendicular to the Z-axis direction is taken as an X-axis direction. A direction perpendicular to the Z-axis direction and the X-axis direction is taken as a Y-axis direction.

The direction from the first portion 20a toward the second portion 20b of the conductive layer 20 is taken as a second direction. The second direction is, for example, the X-axis direction. The first direction crosses the second direction. The conductive layer 20 extends along the X-axis direction.

The second magnetic layer 12 is provided between the first magnetic layer 11 and at least a portion of the third portion 20c. The conductive layer 20 is electrically connected to the second magnetic layer 12. For example, the second magnetic layer 12 may contact the conductive layer 20.

The first nonmagnetic layer 11n includes a portion provided between the first magnetic layer 11 and the second magnetic layer 12.

In the second stacked body SB2, the third magnetic layer 13 is separated from the fourth portion 20d in the first direction (the Z-axis direction). The fourth magnetic layer 14 is provided between the third magnetic layer 13 and at least a portion of the fourth portion 20d. The second nonmagnetic layer 12n includes a portion provided between the third magnetic layer 13 and the fourth magnetic layer 14.

The first magnetic layer 11 and the third magnetic layer 13 are, for example, fixed magnetic layers. The second magnetic layer 12 and the fourth magnetic layer 14 are, for example, free magnetic layers. A first magnetization 11M of the first magnetic layer 11 changes less easily than a second magnetization 12M of the second magnetic layer 12. A third magnetization 13M of the third magnetic layer 13 changes less easily than a fourth magnetization 14M of the fourth magnetic layer 14. The first nonmagnetic layer 11n and the second nonmagnetic layer 12n function as, for example, tunneling layers.

The stacked bodies (the first stacked body SB1, the second stacked body SB2, etc.) function as, for example, magnetic variable resistance elements. For example, a TMR (Tunnel Magneto Resistance) effect occurs in the stacked bodies. For example, the electrical resistance of a path including the first magnetic layer 11, the first nonmagnetic layer 11n, and the second magnetic layer 12 changes according to the difference between the orientation of the first magnetization 11M and the orientation of the second magnetization 12M. For example, the electrical resistance of a path including the third magnetic layer 13, the second nonmagnetic layer 12n, and the fourth magnetic layer 14 changes according to the difference between the orientation of the third magnetization 13M and the orientation of the fourth magnetization 14M. The stacked body has, for example, a magnetic tunnel junction (MTJ).

In the example, the first magnetization 11M and the third magnetization 13M are aligned with the Y-axis direction. The second magnetization 12M and the fourth magnetization 14M are aligned with the Y-axis direction. The first magnetic layer 11 and the third magnetic layer 13 function as, for example, reference layers. The second magnetic layer 12 and the fourth magnetic layer 14 function as, for example, memory layers.

The second magnetic layer 12 and the fourth magnetic layer 14 function as, for example, layers that store information. For example, a first state in which the second magnetization 12M is oriented in one direction corresponds to first information that is stored. A second state in which the second magnetization 12M is oriented in another direction corresponds to second information that is stored. For example, the first information corresponds to one of "0" or "1." The second information corresponds to the other of "0" or "1." Similarly, the orientations of the fourth magnetization 14M correspond to this information.

For example, the second magnetization 12M and the fourth magnetization 14M can be controlled by a current (a program current) flowing in the conductive layer 20. For example, the orientations of the second magnetization 12M and the fourth magnetization 14M can be controlled by the orientation of the current (the program current) of the conductive layer 20. For example, the conductive layer 20 functions as, for example, a Spin Orbit Layer (SOL). For example, the orientation of the second magnetization 12M can be changed by spin-orbit torque generated between the conductive layer 20 and the second magnetic layer 12. For example, the orientation of the fourth magnetization 14M can be changed by spin-orbit torque generated between the conductive layer 20 and the fourth magnetic layer 14. The spin-orbit torque is based on the current (the program current) flowing in the conductive layer 20.

The current (the program current) is supplied by the controller 70. The controller includes, for example, a drive circuit 75.

The controller 70 is electrically connected to the first portion 20a, the second portion 20b, and the first magnetic layer 11. The controller 70 supplies a current to the conductive layer 20. In the example, the controller 70 is further electrically connected to the third magnetic layer 13.

For example, the drive circuit 75 and the first magnetic layer 11 are electrically connected by an interconnect 70a. The drive circuit 75 and the third magnetic layer 13 are electrically connected by an interconnect 70d. The drive circuit 75 and the first portion 20a are electrically connected by an interconnect 70b. The drive circuit 75 and the second portion 20b are electrically connected by an interconnect 70c.

In the example, a first switch element Sw1 (e.g., a transistor) is provided on a current path (the interconnect 70a) between the drive circuit 75 and the first magnetic layer 11. A second switch element Sw2 (e.g., a transistor) is provided on a current path (the interconnect 70d) between the drive circuit 75 and the third magnetic layer 13. A switch element SwS1 (e.g., a transistor) is provided on a current path (the interconnect 70b) between the drive circuit 75 and the first portion 20a. For example, these switch elements are included in the controller 70.

In a first program operation, the controller 70 supplies a first current Iw1 (a first program current) to the conductive layer 20. Thereby, the first state is formed. The first current Iw1 is a current from the first portion 20a toward the second portion 20b. In a second program operation, the controller 70 supplies a second current Iw2 (a second program current) to the conductive layer 20. Thereby, the second state is formed. The second current Iw2 is a current from the second portion 20b toward the first portion 20a.

A first electrical resistance between the first magnetic layer 11 and the first portion 20a after the first program operation (in the first state) is different from a second electrical resistance between the first magnetic layer 11 and the first portion 20a after the second program operation (in the second state).

For example, the electrical resistance difference is based on the difference of the states of the second magnetization 12M between the first state and the second state.

Similarly, the controller 70 implements a third program operation of supplying the first current Iw1 to the conductive layer 20. Thereby, a third state is formed. The controller 70 implements a fourth program operation of supplying the second current Iw2 to the conductive layer 20. Thereby, a fourth state is formed. A third electrical resistance between the third magnetic layer 13 and the first portion 20a after the third program operation (in the third state) is different from a fourth electrical resistance between the third magnetic layer 13 and the first portion 20a after the fourth program operation (in the fourth state).

For example, the electrical resistance difference is based on the difference of the states of the fourth magnetization 14M between the third state and the fourth state.

In a read operation, the controller 70 may sense a characteristic (a voltage, a current, etc.) corresponding to the electrical resistance between the first magnetic layer 11 and the first portion 20a. In the read operation, the controller 70 may sense a characteristic (a voltage, a current, etc.) corresponding to the electrical resistance between the third magnetic layer 13 and the first portion 20a.

One of the first stacked body SB1 (a first memory cell) or the second stacked body SB2 (a second memory cell) is selected by the operations of the first switch element Sw1 and the second switch element Sw2 recited above. The program operation and the read operation of the desired memory cell are performed.

In the embodiment as shown in FIG. 1B, the first nonmagnetic layer 11n includes a first region LR1 and a second region SR1. The first region LR1 is provided between the first magnetic layer 11 and the second magnetic layer 12. The second region SR1 is continuous with the first region LR1. The second region SR1 overlaps at least a portion of the second magnetic layer 12 in the second direction (the X-axis direction).

The second region SR1 is seamless and continuous with the first region LR1. A portion of a film used to form the first nonmagnetic layer 11n is positioned between the second magnetic layer 12 and the first magnetic layer 11. This portion is used to form the first region LR1. Another portion of the film used to form the first nonmagnetic layer 11n is provided for at least a portion of the side surface of the second magnetic layer 12. The second region SR1 contacts at least a portion of the second magnetic layer 12. The second region SR1 does not overlap the first magnetic layer 11 in the second direction (the X-axis direction).

Similarly, the second nonmagnetic layer 12n includes a third region LR2 and a fourth region SR2. The third region LR2 is provided between the third magnetic layer 13 and the fourth magnetic layer 14. The fourth region SR2 is continuous with the third region LR2. The fourth region SR2 overlaps at least a portion of the fourth magnetic layer 14 in the second direction.

The fourth region SR2 is seamless and continuous with the third region LR2. A portion of a film used to form the second nonmagnetic layer 12n is positioned between the fourth magnetic layer 14 and the third magnetic layer 13. This portion is used to form the third region LR2. Another portion of the film used to form the second nonmagnetic layer 12n is provided for at least a portion of the side surface of the fourth magnetic layer 14. The fourth region SR2 contacts at least a portion of the fourth magnetic layer 14. The fourth region SR2 does not overlap the third magnetic layer 13 in the second direction.

For example, the second region SR1 protects the end portion (the vicinity of the side surface) of the second magnetic layer 12 when patterning the first stacked body SB1. For example, the fourth region SR2 protects the end portion (the vicinity of the side surface) of the fourth magnetic layer 14 when patterning the second stacked body SB2.

The characteristics of the end portions of the second magnetic layer 12 and the fourth magnetic layer 14 are maintained in the desired states. Thereby, for example, the effective surface area of these magnetic layers is wider. The sizes of the magnetic layers can be reduced because the effective surface area inside the magnetic layers can be enlarged. For example, the storage density can be increased.

The first nonmagnetic layer 11n (and the second nonmagnetic layer 12n) includes, for example, at least one selected from the group consisting of Mg and Al, and at least one selected from the group consisting of oxygen and nitrogen. For example, these nonmagnetic layers include MgO. A high MR ratio is obtained in the first region LR1 by using such materials. On the other hand, by using such materials, a high insulative property is obtained in the second region SR1; and, for example, the leakage current at the end portion of the second magnetic layer 12, etc., can be suppressed. The size of the memory cell can be reduced. For example, the storage density can be increased.

As shown in FIG. 1C and FIG. 1D, a first insulating region IR1 may be further provided in the magnetic memory device 110. The direction from the first insulating region IR1 toward the second magnetic layer 12 is aligned with a third direction (a direction crossing a plane (the Z-X plane) including the first direction and the second direction). The third direction is, for example, the Y-axis direction. The direction from the first insulating region IR1 toward the fourth magnetic layer 14 is aligned with the third direction (the Y-axis direction).

The first insulating region IR1 includes, for example, at least one selected from the group consisting of Si and Al and at least one selected from the group consisting of oxygen and nitrogen. The first insulating region IR1 includes, for example, at least one of $SiO_2$, SiN, or $Al_2O_3$.

As shown in FIG. 1B, the second magnetic layer 12 is positioned between two portions of the second region SR1 in the X-axis direction. On the other hand, the second magnetic layer 12 is positioned between two portions of the first insulating region IR1 in the Y-axis direction. The material of the layer (e.g., the first insulating region IR1) provided at the side surface of the second magnetic layer 12 along the Y-axis direction is different from the material of the layer (e.g., the second region SR1) provided at the side surface of the second magnetic layer 12 along the X-axis direction. For example, the linear expansion coefficients are different for the different materials.

For example, materials that have mutually-different linear expansion coefficients are provided at the side surfaces of the second magnetic layer 12 in different directions. Thereby, anisotropic stress is applied to the second magnetic layer 12. The magnetic characteristics of the second magnetic layer 12 are controlled appropriately by the stress.

The second magnetic layer 12 includes, for example, a second metal including at least one selected from the group consisting of Fe, Co, and Ni. For example, the linear expansion coefficient of Fe is $12.4 \times 10^{-6}$/K. The linear expansion coefficient of Co is $12.8 \times 10^{-6}$/K.

For example, on one hand, the linear expansion coefficient of MgO is $9.7 \times 10^{-6}$/K. The linear expansion coefficient of $SiO_2$ is $0.5 \times 10^{-6}$/K.

The case where the second region SR1 includes MgO and the first insulating region IR1 includes $SiO_2$ is as follows. The absolute value of the difference between the linear expansion coefficient of the second region SR1 and the linear expansion coefficient of the second magnetic layer 12 is less than the absolute value of the difference between the linear expansion coefficient of the first insulating region IR1 and the linear expansion coefficient of the second magnetic layer 12.

For example, the residual stress of the second magnetic layer 12 is suppressed by such a relationship of the linear expansion coefficients. For example, a stacked film that includes the film used to form the second magnetic layer 12, the film used to form the first nonmagnetic layer 11n, and the film used to form the first magnetic layer 11 is formed on the film used to form the conductive layer 20. The first stacked body SB1, the second stacked body SB2, etc., are formed by patterning the stacked film; further, the peripheries of the first stacked body SB1, the second stacked body SB2, etc., are buried in the insulating layers of the first insulating region IR1, etc. Heat treatment or the like is performed to improve the crystallinity of these stacked bodies. Residual stress occurs in the magnetic layers included in the stacked bodies due to the heat treatment. The residual stress is caused by the linear expansion coefficient of the first insulating region IR1 being different from the linear expansion coefficients of the magnetic layers.

In the embodiment, the second region SR1 is provided at a portion of the side surface of the second magnetic layer 12. The linear expansion coefficient of the second region SR1 is close to the linear expansion coefficient of the second magnetic layer 12. Thereby, for example, the residual stress of X-axis direction of the second magnetic layer 12 is relaxed.

By relaxing the residual stress of the second magnetic layer 12, for example, the necessary recording current can be reduced. For example, the storage density can be increased.

A particularly high insulative property of the first insulating region IR1 is obtained in the case where the first insulating region IR1 includes at least one selected from the group consisting of Si and Al and at least one selected from the group consisting of oxygen and nitrogen (e.g., $SiO_2$, etc.). Thereby, the leakage current of the stacked body can be reduced. For example, the leakage current can be suppressed compared to a reference example in which the first insulating region IR1 includes MgO.

In the embodiment, at the second region SR1, at least a portion of the side surface of the second magnetic layer 12 is covered with the film used to form the first nonmagnetic layer 11n including a material for which a high MR ratio is obtained. Thereby, good characteristics of the side surface portion of the second magnetic layer 12 can be maintained. Further, the residual stress can be suppressed. For example, the recording current can be suppressed. The operations can be more stable.

As shown in FIG. 1B, a second insulating region IR2 may be further provided in the magnetic memory device 110. The direction from the second insulating region IR2 toward at least a portion of the first magnetic layer 11 is aligned with the second direction (the X-axis direction). The second insulating region IR2 includes at least one selected from the group consisting of Si and Al, and at least one selected from the group consisting of oxygen and nitrogen.

For example, the material of the second insulating region IR2 may be the same as the material of the first insulating region IR1. For example, the first stacked body SB1 is provided between two first insulating regions IR1 in the Y-axis direction. For example, a portion (the first magnetic layer 11) of the first stacked body SB1 is provided between two second insulating regions IR2 in the X-axis direction. These insulating regions are, for example, inter-layer insulating films.

In one example of the operation of the magnetic memory device 110 as shown in FIG. 1A, for example, the first portion 20a is set to a reference potential V0; and a first voltage V1 (e.g., a select voltage) is applied to the first magnetic layer 11.

At this time, for example, the electrical resistance of the first stacked body SB1 changes according to the orientation of the current flowing in the conductive layer 20. On the other hand, the first portion 20a is set to the reference potential V0; and a second voltage V2 (e.g., an unselect voltage) is applied to the first magnetic layer 11. The second voltage V2 is different from the first voltage V1. When the second voltage V2 is applied, for example, the electrical resistance of the first stacked body SB1 substantially does not change even in the case where a current flows in the conductive layer 20. The change of the electrical resistance corresponds to the change of the state of the first stacked body SB1. For example, the change of the electrical resistance corresponds to the change of the orientation of the second magnetization 12M of the second magnetic layer 12. For example, the second voltage V2 is different from the first voltage V1. For example, the absolute value of the potential difference between the reference potential VO and the first voltage V1 is greater than the absolute value of the potential difference between the reference potential VO and the second voltage V2. For example, the polarity of the first voltage V1 may be different from the polarity of the second voltage V2. Such an electrical resistance difference is obtained by a control of the controller 70.

For example, the controller 70 performs a first operation and a second operation. These operations are operations when the select voltage is applied to the stacked body SB1. In the first operation, the controller 70 supplies the first current Iw1 to the conductive layer 20 from the first portion 20a toward the second portion 20b (referring to FIG. 1A). In the second operation, the controller 70 supplies the second current Iw2 to the conductive layer 20 from the second portion 20b toward the first portion 20a (referring to FIG. 1A).

The first electrical resistance between the first magnetic layer 11 and the first portion 20a after the first operation is different from the second electrical resistance between the first magnetic layer 11 and the first portion 20a after the second operation. For example, such an electrical resistance difference corresponds to the change of the orientation of the second magnetization 12M of the second magnetic layer 12. For example, the orientation of the second magnetization 12M changes due to the current (the program current) flowing through the conductive layer 20. For example, it is considered that this is based on the spin Hall effect. For example, it is considered that the change of the orientation of the second magnetization 12M is based on spin-orbit coupling.

For example, due to the first operation, the second magnetization 12M has a component having the same orientation as the first magnetization 11M. A "parallel" magnetization is obtained. On the other hand, due to the second operation, the second magnetization 12M has a component having the reverse orientation of the orientation of the first magnetization 11M. An "antiparallel" magnetization is obtained. In such a case, the first electrical resistance after the first operation is lower than the second electrical resistance after the second operation. Such an electrical resistance difference corresponds to the information to be stored. For example, the different multiple magnetizations correspond to the information to be stored.

The controller 70 may further implement a third operation and a fourth operation. In the third operation, the potential difference between the first portion 20a and the first magnetic layer 11 is set to the second voltage V2; and the first current Iw1 is supplied to the conductive layer 20. In the fourth operation, the potential difference between the first portion 20a and the first magnetic layer 11 is set to the second voltage V2; and the second current Iw2 is supplied to the conductive layer 20. In the third operation and the fourth operation, for example, the electrical resistance of the first stacked body SB1 substantially does not change even in the case where a current flows in the conductive layer 20. The first electrical resistance between the first magnetic layer 11 and the first portion 20a after the first operation is different from the second electrical resistance between the first magnetic layer 11 and the first portion 20a after the second operation. The absolute value of the difference between the first electrical resistance and the second electrical resistance is greater than the absolute value of the difference between the third electrical resistance between the first magnetic layer 11 and the first portion 20a after the third operation and the fourth electrical resistance between the first magnetic layer 11 and the first portion 20a after the fourth operation.

As described above, the controller 70 is electrically connected to the first stacked body SB1 (the first magnetic layer 11) and the second stacked body SB2 (the third magnetic layer 13). When programming the information to the first stacked body SB1, the prescribed select voltage is applied to the first magnetic layer 11. At this time, the unselect voltage is applied to the second stacked body SB2. On the other hand, when programming the information to the second stacked body SB2, the prescribed select voltage is applied to the third magnetic layer 13. At this time, the unselect voltage is applied to the first stacked body SB1. The application of a voltage of 0 volts also is included in "a voltage being applied." The potential of the select voltage is different from the potential of the unselect voltage.

The multiple stacked bodies correspond respectively to multiple memory cells. It is possible to store mutually-different information in the multiple memory cells. When storing the information in the multiple memory cells, for example, one of "1" or "0" may be stored in the multiple memory cells; and subsequently, the other of "1" or "0" may be stored in some of the multiple memory cells as desired. For example, one of "1" or "0" may be stored in one of the multiple memory cells; and subsequently, one of "1" or "0" may be stored in another one of the multiple memory cells.

In the description recited above, the first portion 20a and the second portion 20b are interchangeable with each other. For example, the electrical resistance recited above may be the electrical resistance between the first magnetic layer 11 and the second portion 20b. The electrical resistance recited above may be the electrical resistance between the third magnetic layer 13 and the second portion 20b.

Figure 2A:
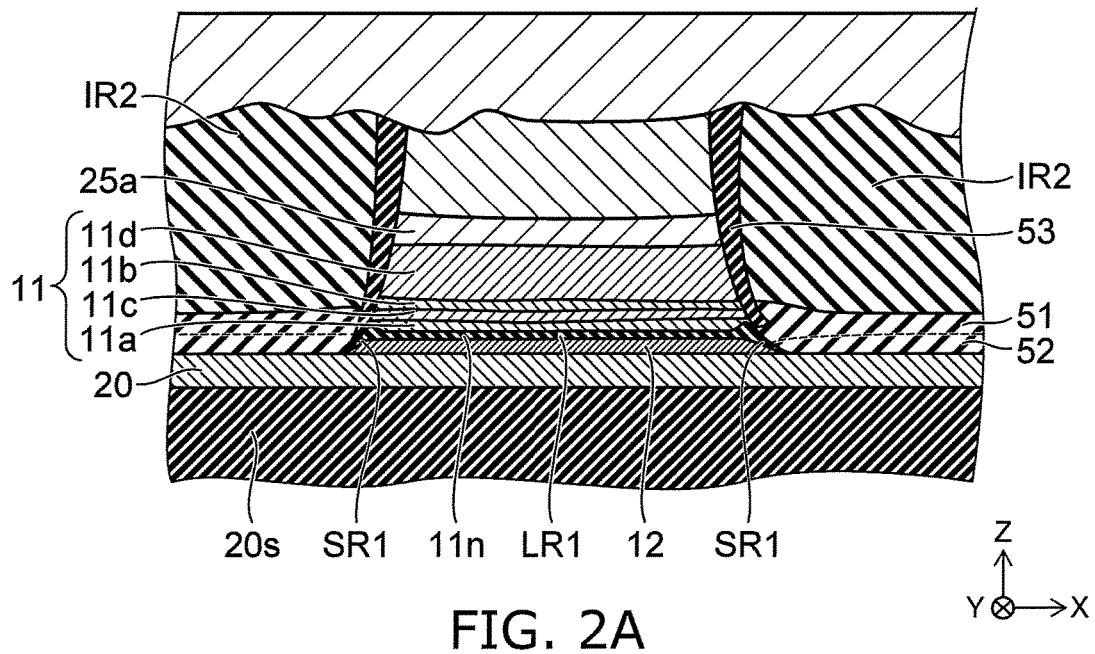
FIG. 2A and FIG. 2B are schematic views illustrating the magnetic memory device according to the first embodiment.
Figure 2B:
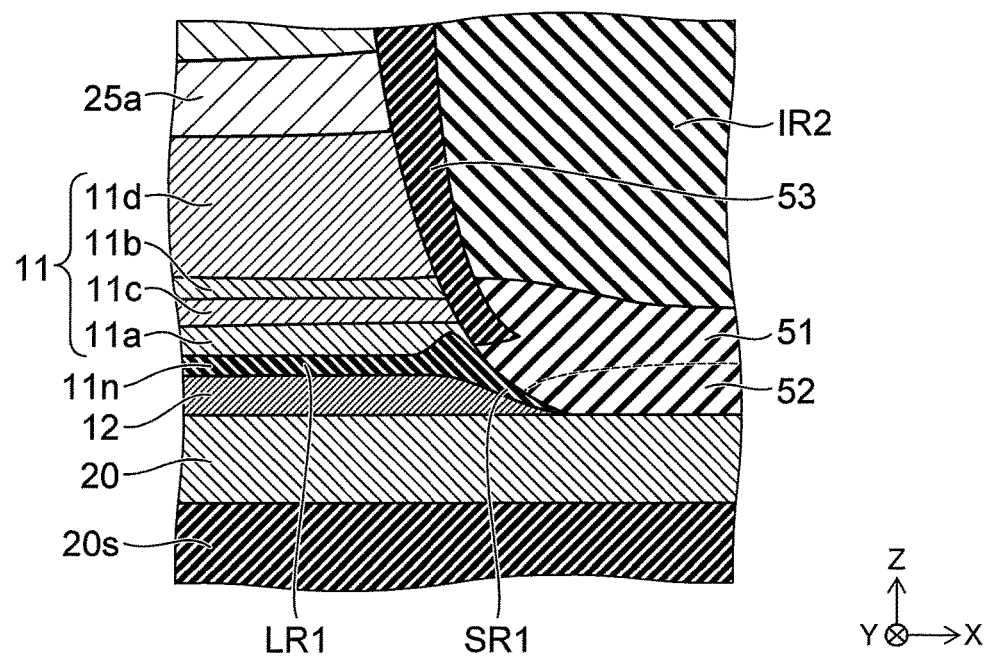

FIG. 2A and FIG. 2B are schematic views illustrating the magnetic memory device according to the first embodiment.

These drawings are schematic views of a portion of the magnetic memory device 110. FIG. 2B is an enlarged view of the portion of FIG. 2A. For example, the structure shown in FIG. 2A and FIG. 2B is observed by a cross-section TEM (Transmission Electron Microscope).

As shown in FIG. 2A, the conductive layer 20 is provided on the base body 20s. In the example, the conductive layer 20 is a Ta film. The conductive layer 20 thickness is about 5 nm.

The second magnetic layer 12 is provided on a portion of the conductive layer 20. The second magnetic layer 12 is a CoFeB film. The first region LR1 of the first nonmagnetic layer 11n is provided on the second magnetic layer 12. A portion (the second region SR1) of the first nonmagnetic layer 11n covers the side surface of the second magnetic layer 12.

The first magnetic layer 11 is provided on the first region LR1. In the example, the first magnetic layer 11 includes a magnetic film 11a, a magnetic film 11b, and a nonmagnetic film 11c. The magnetic film 11a is positioned between the first region LR1 and the magnetic film 11b. The nonmagnetic film 11c is positioned between the magnetic film 11a and the magnetic film 11b. The magnetic film 11a and the magnetic film 11b each are, for example, CoFeB films (having thicknesses of about 2 nm). The nonmagnetic film 11c is, for example, a Ru film (having a thickness of about 0.9 nm).

In the example, the first magnetic layer 11 further includes an IrMn film 11d (e.g., 8 nm). The magnetic film 11b is positioned between the IrMn film 11d and the first nonmagnetic layer 11n (the first region LR1).

In the example, a Ta film 25a is provided on the IrMn film 11d.

In the example recited above, the second magnetic layer 12 includes Fe and Co. In the embodiment, the second magnetic layer 12 includes the second metal. The second metal may include, for example, at least one selected from the group consisting of Fe, Co, and Ni. The second magnetic layer 12 may include the second metal and B.

A first compound region 51, a second compound region 52, and a third compound region 53 are further provided in the example.

At least a portion of the second region SR1 is positioned between the first compound region 51 and at least a portion of the second magnetic layer 12 in the second direction (the X-axis direction). The first compound region 51 includes the second metal recited above and at least one selected from the group consisting of oxygen and nitrogen. A portion of the second region SR1 may be positioned between the first compound region 51 and at least a portion of the second magnetic layer 12 in the Z-axis direction.

For example, the first compound region 51 can be formed by introducing oxygen (or nitrogen) to the film used to form the second magnetic layer 12. Thereby, the first compound region 51 includes oxygen (or nitrogen) and the second metal (Fe, Co, Ni, etc.) included in the second magnetic layer 12. The first compound region 51 includes, for example, Fe and Co. The first compound region 51 is, for example, nonmagnetic. The first compound region 51 is, for example, insulative.

On the other hand, at least a portion of the second region SR1 is positioned between the second compound region 52 and at least a portion of the second magnetic layer 12 in the second direction (the X-axis direction). At least a portion of the second compound region 52 overlaps the first compound region 51 in the Z-axis direction.

For example, the second compound region 52 includes the first metal and at least one selected from the group consisting of oxygen and nitrogen. As described above, the first metal includes at least one selected from the group consisting of Ta, W, Re, Os, Ir, Pt, Pd, Cu, and Ag. The second compound region 52 includes, for example, Ta and O. The second compound region 52 is, for example, insulative. Or, the second compound region 52 may include another element and at least one selected from the group consisting of oxygen and nitrogen. The other element includes, for example, at least one selected from the group consisting of B, Mg, Al, Si, Hf, Ti, and Zr. The second compound region 52 may include the other element recited above, the first metal, and at least one selected from the group consisting of oxygen and nitrogen.

The third compound region 53 overlaps the first magnetic layer 11 in the second direction (the X-axis direction). In the example, at least a portion of the third compound region 53 is positioned between the first magnetic layer 11 and the second insulating region IR2 (e.g., $SiO_2$). The third compound region 53 includes, for example, oxygen and a metallic element included in the first magnetic layer 11. The third compound region 53 is, for example, insulative. The third compound region 53 may further include, for example, the second metal.

For example, the third compound region 53 is formed by a process of patterning a stacked film used to form the first stacked body SB1. For example, in the patterning process, a compound that includes oxygen and a portion of the stacked film is formed; and the compound is adhered to the side wall of the first stacked body SB1. The adhered compound is used to form the third compound region 53.

After the patterning, for example, the film used to form the second magnetic layer 12 and the film used to form the conductive layer 20 are processed using a gas including oxygen. For example, the first compound region 51 and the second compound region 52 are formed by this processing.

The configuration illustrated in FIG. 2A and FIG. 2B will now be described further.

Figure 3:
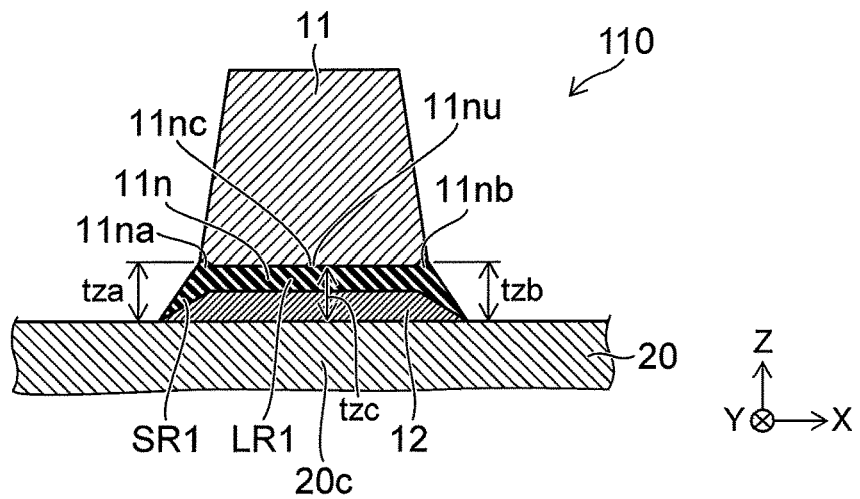
FIG. 3 is a schematic view illustrating the magnetic memory device according to the first embodiment.

FIG. 3 is a schematic view illustrating the magnetic memory device according to the first embodiment.

As shown in FIG. 3, the first region LR1 has a first surface 11nu. The first surface 11nu opposes the first magnetic layer 11. The first surface 11nu is concave. The first surface 11nu is concave when the first region LR1 is cut by the Z-X plane. For example, the height of the end of the first surface 11nu is higher than the height of the central portion of the first surface 11nu.

The first surface 11nu includes a first surface portion 11na, a second surface portion 11nb, and a third surface portion 11nc. The direction from the first surface portion 11na toward the second surface portion 11nb is aligned with the second direction (the X-axis direction). The position in the second direction of the third surface portion 11nc is between the position in the second direction of the first surface portion 11na and the position in the second direction of the second surface portion 11nb. A distance tzc along the first direction (the Z-axis direction) between the third surface portion 11nc and the third portion 20c is shorter than a distance tza along the first direction between the first surface portion 11na and the third portion 20c. The distance tzc is shorter than a distance tzb along the first direction between the second surface portion 11nb and the third portion 20c.

For example, such a concave configuration is obtained by performing processing using a gas including oxygen in the state in which the first nonmagnetic layer 11n is positioned on the film used to form the second magnetic layer 12 as described below. For example, by introducing oxygen to the film used to form the second magnetic layer 12, the volume of the film is increased. Thereby, the end portions of a portion (the first region LR1) of the first nonmagnetic layer 11n are pushed upward. Thereby, the concave configuration is obtained.

It is considered that stress is applied to the second magnetic layer 12 by forming the concave configuration. For example, it is considered that the stress increases the controllability of the second magnetization 12M of the second magnetic layer 12.

Figure 4:
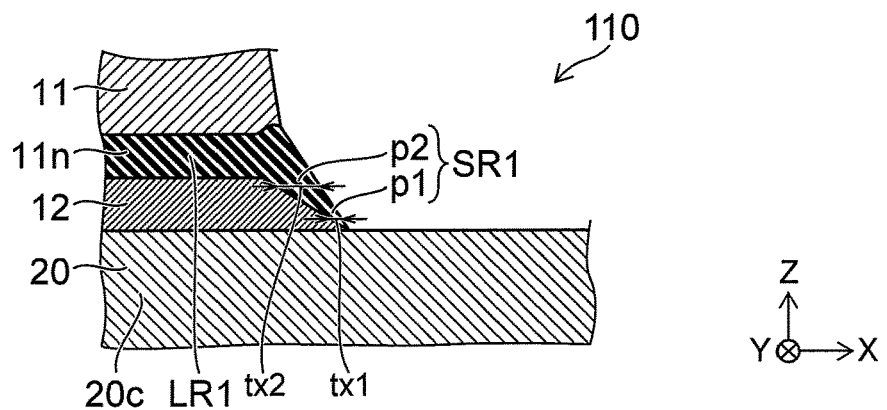
FIG. 4 is a schematic view illustrating the magnetic memory device according to the first embodiment.

FIG. 4 is a schematic view illustrating the magnetic memory device according to the first embodiment.

A portion that includes the second region SR1 is enlarged and illustrated in FIG. 4.

As shown in FIG. 4, the width of the lower portion of the second region SR1 is narrower than the upper portion of the second region SR1. For example, the second region SR1 includes a first partial region p1 and a second partial region p2. The distance along the first direction (the Z-axis direction) between the first partial region p1 and the third portion 20c is shorter than the distance along the first direction between the second partial region p2 and the third portion 20c. For example, the first partial region p1 is positioned lower than the second partial region p2.

A length tx1 along the second direction (the X-axis direction) of the first partial region p1 (the lower portion) is shorter than a length tx2 along the second direction of the second partial region p2.

For example, such a structure is obtained by performing processing using a gas including oxygen in a state in which the first nonmagnetic layer 11n is positioned on the film used to form the second magnetic layer 12 as described below. By this processing, oxygen is introduced to the film used to form the second magnetic layer 12 to become nonmagnetic. The portion where oxygen is not introduced is used to form the second magnetic layer 12. The film (the second region SR1) used to form the first nonmagnetic layer 11n covers the side surface of the second magnetic layer 12 from above. Therefore, there are cases where the thickness (the length in the X-axis direction) of the lower portion (the first partial region p1) of the second region SR1 is thinner than the thickness (the length in the X-axis direction) of the upper portion (the second partial region p2) of the second region SR1.

According to such a manufacturing method, the second magnetic layer 12 is formed in a state in which the side portion of the second magnetic layer 12 is protected by the film used to form the first nonmagnetic layer 11n. Thereby, the degradation of the magnetic characteristics of the side portion of the second magnetic layer 12 is suppressed.

In the embodiment, the thickness along the second direction (the X-axis direction) of at least a portion of the second region SR1 is 0.5 nm or more. For example, the thickness along the second direction of the second partial region p2 corresponds to the length tx2. The length tx2 is, for example, 0.5 nm or more. By such a thickness, for example, the side portion of the second magnetic layer 12 can be protected effectively.

Figure 5:
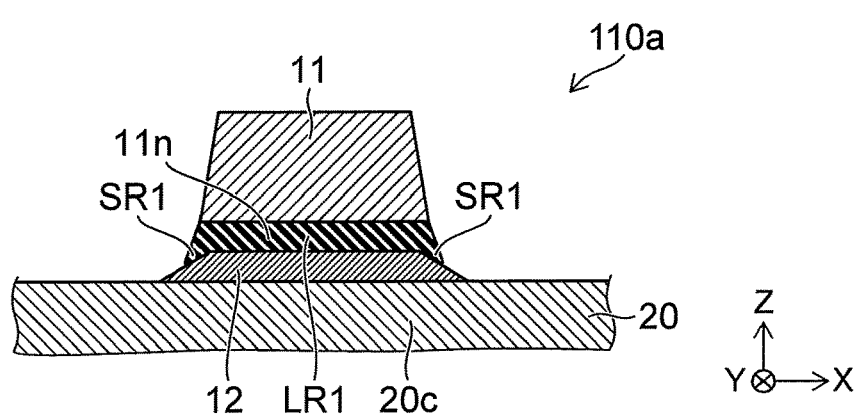
FIG. 5 is a schematic view illustrating another magnetic memory device according to the first embodiment.

FIG. 5 is a schematic view illustrating another magnetic memory device according to the first embodiment.

In the magnetic memory device 110a according to the embodiment as shown in FIG. 5, the second region SR1 overlaps a portion of the second magnetic layer 12 in the second direction (the X-axis direction). The second region SR1 does not overlap another portion of the second magnetic layer 12 in the second direction. Thus, in the embodiment, the second region SR1 may overlap a portion of the second magnetic layer 12 in the second direction.

In such a case, the other portion of the second magnetic layer 12 recited above may contact the first compound region 51 or the second compound region 52 (referring to FIG. 2A) in the X-axis direction. The first compound region 51 and the second compound region 52 are not illustrated in FIG. 5.

In one example according to the embodiment as recited above, the magnetic memory device 110 includes the conductive layer 20, the first magnetic layer 11, the second magnetic layer 12, the first nonmagnetic layer 11n, the second region SR1, the first insulating region IR1, and the controller 70. The second region SR1 may be provided separately from the first nonmagnetic layer 11n. The first nonmagnetic layer 11n includes the first region LR1. The first nonmagnetic layer 11n includes Mg and at least one selected from the group consisting of oxygen and nitrogen. The first region LR1 is provided between the first magnetic layer 11 and the second magnetic layer 12. The second region SR1 includes Mg and at least one selected from the group consisting of oxygen and nitrogen. The second region SR1 overlaps at least a portion of the second magnetic layer 12 in the second direction (the X-axis direction). The first insulating region IR1 includes at least one selected from the group consisting of Si and Al, and at least one selected from the group consisting of oxygen and nitrogen. The direction from the first insulating region IR1 toward the second magnetic layer 12 is aligned with the third direction (e.g., the Y-axis direction).

In one example according to the embodiment, the magnetic memory device 110 includes the conductive layer 20, the first magnetic layer 11, the second magnetic layer 12, the first nonmagnetic layer 11n, the second region SR1, the first insulating region IR1, and the controller 70. The second region SR1 may be provided separately from the first nonmagnetic layer 11n. The first nonmagnetic layer 11n includes the first region LR1 provided between the first magnetic layer 11 and the second magnetic layer 12. The second region SR1 overlaps at least a portion of the second magnetic layer 12 in the second direction (the X-axis direction). The direction from the first insulating region IR1 toward the second magnetic layer 12 is aligned with the third direction (the Y-axis direction). The absolute value of the difference between the linear expansion coefficient of the second region SR1 and the linear expansion coefficient of the second magnetic layer 12 is less than the absolute value of the difference between the linear expansion coefficient of the first insulating region IR1 and the linear expansion coefficient of the second magnetic layer 12.

Second Embodiment

The second embodiment relates to a method for manufacturing the magnetic memory device according to the first embodiment.

Figure 6:
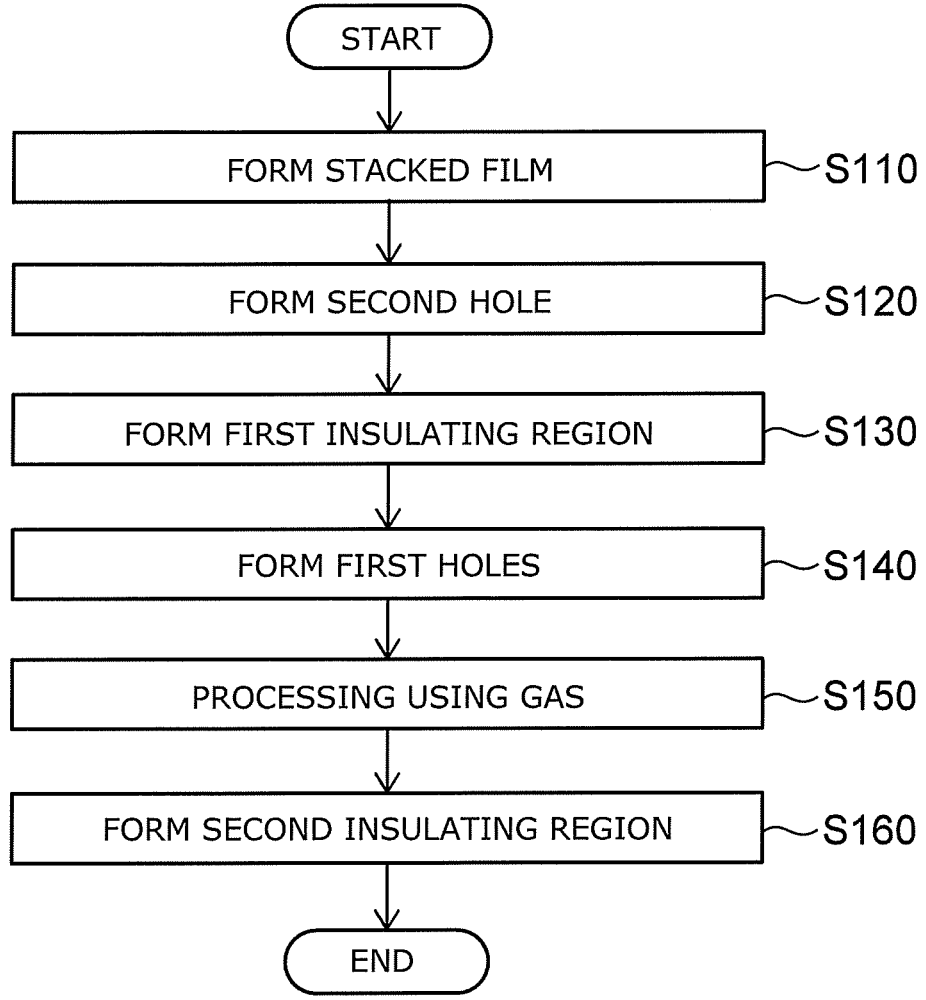
FIG. 6 is a flowchart illustrating the method for manufacturing the magnetic memory device according to the second embodiment.

FIG. 6 is a flowchart illustrating the method for manufacturing the magnetic memory device according to the second embodiment.

A stacked film is formed as shown in FIG. 6 (step S110). Then, a second hole is formed (step S120). The first insulating region IR1 is formed in the second hole (step S130). A first hole is formed (step S140); and processing using a gas is performed (step S150). Subsequently, the second insulating region IR2 is formed (step S160).

In the description recited above, the order of the steps recited above may be interchanged within the extent of technical feasibility. For example, step S120 (the forming of the second hole) and step S130 (the forming of the first insulating region IR1) may be implemented after step S140 (the forming of the first hole) and step S150 (the processing using the gas).

An example of the method for manufacturing will now be described.

FIG. 7A, FIG. 7B, FIG. 8A, FIG. 8B, FIG. 9A, FIG. 9B, FIG. 10, FIG. 11, and FIG. 12 are schematic views illustrating the method for manufacturing the magnetic memory device according to the second embodiment.

FIG. 7A, FIG. 8A, FIG. 9A, FIG. 11, and FIG. 12 are plan views. FIG. 7B, FIG. 8B, FIG. 9B, and FIG. 10 are cross-sectional views.

Figure 7A:
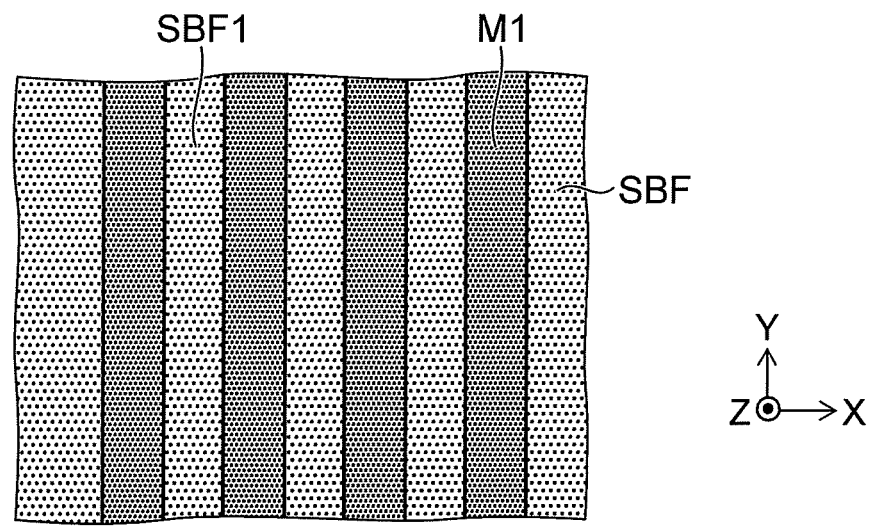
FIG. 7A and FIG. 7B are schematic views illustrating a method for manufacturing the magnetic memory device according to the second embodiment.
Figure 7B:
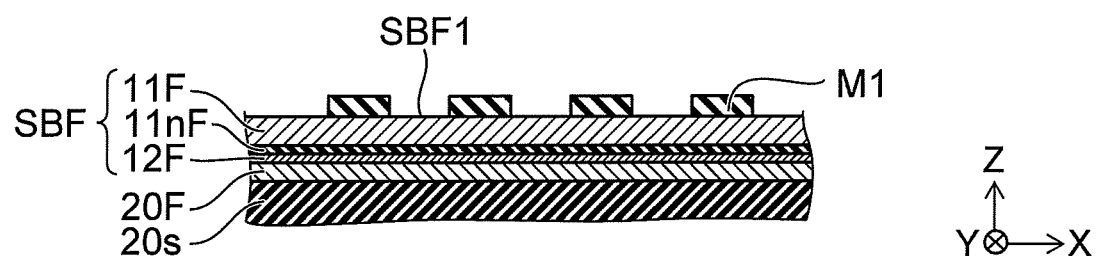

As shown in FIG. 7A and FIG. 7B, a stacked film SBF is formed on a conductive film 20F (step S110, referring to FIG. 6). The conductive film 20F is provided on the base body 20s. The conductive film 20F includes the first metal. The conductive film 20F may further include the other element recited above (at least one selected from the group consisting of B, Mg, Al, Si, Hf, Ti, and Zr). The stacked film SBF includes a first magnetic film 11F, a second magnetic film 12F, and a first nonmagnetic film 11nF. The second magnetic film 12F is provided between the first magnetic film 11F and the conductive film 20F. The second magnetic film 12F includes the second metal. The second metal includes, for example, at least one selected from the group consisting of Fe, Co, and Ni. The first nonmagnetic film 11nF is provided between the first magnetic film 11F and the second magnetic film 12F.

Such a stacked film SBF is patterned. For example, a first mask M1 is formed on a front surface SBF1 of the stacked film SBF.

As shown in FIG. 7A, the first mask M1 has a configuration of multiple band configurations extending in the Y-axis direction. The stacked film SBF is exposed in the opening of the first mask M1. For example, the first mask M1 may be formed by double patterning technology.

Figure 8A:
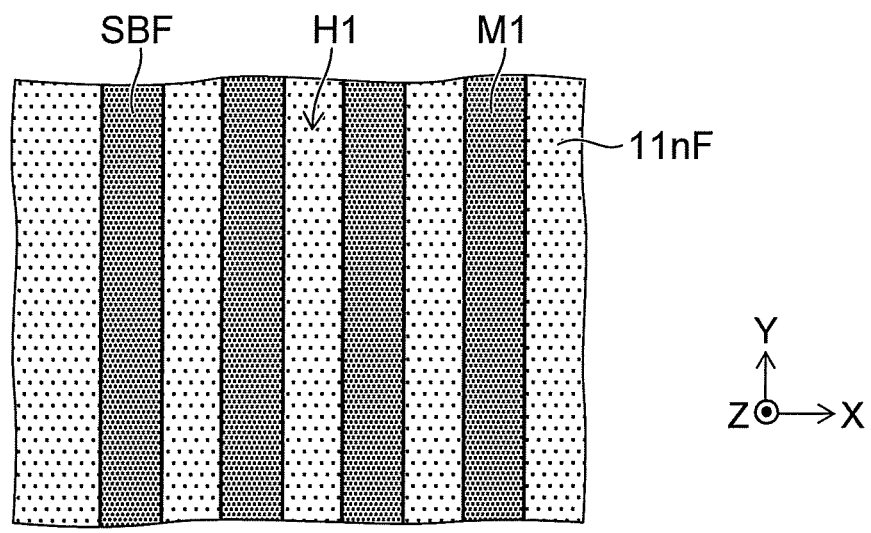
FIG. 8A and FIG. 8B are schematic views illustrating the method for manufacturing the magnetic memory device according to the second embodiment.
Figure 8B:
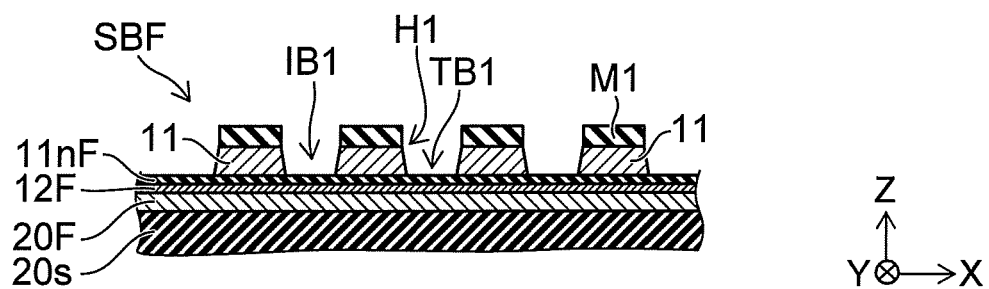

As shown in FIG. 8A and FIG. 8B, multiple first holes H1 are formed in the stacked film SBF by removing a portion of the first magnetic film 11F (step S140, referring to FIG. 6). As shown in FIG. 8B, the multiple first holes H1 can be formed by irradiating an ion beam IB1 on the stacked film SBF. For example, the ion beam IB1 includes Ar ions. For example, the multiple first holes H1 are formed by ion milling.

The multiple holes H1 are arranged in the second direction (the X-axis direction). The second direction crosses the first direction (the Z-axis direction) that is perpendicular to the front surface SBF1 of the stacked film SBF. The multiple first holes H1 may be, for example, trenches extending in the Y-axis direction.

The multiple first holes H1 do not pierce through the first nonmagnetic film 11nF. A portion of the first nonmagnetic film 11nF, a portion of the second magnetic film 12F, and a portion of the conductive film 20F are positioned under bottom portions TB1 of the multiple first holes H1.

Figure 9A:
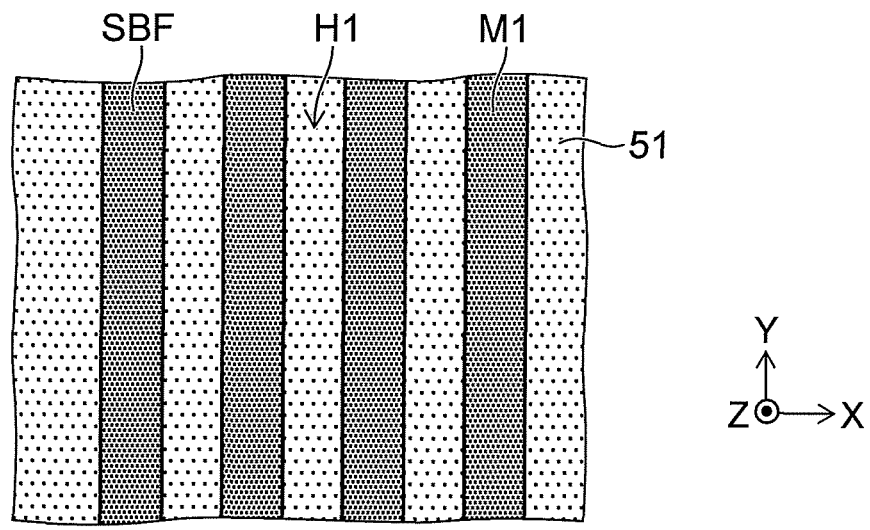
FIG. 9A and FIG. 9B are schematic views illustrating the method for manufacturing the magnetic memory device according to the second embodiment.
Figure 9B:
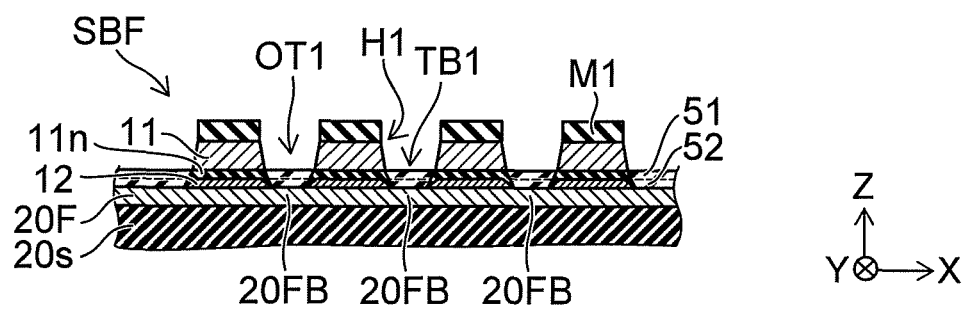

As shown in FIG. 9A and FIG. 9B, processing using a gas OT1 is performed (step S150, referring to FIG. 6). The gas OT1 includes a first element. The first element includes at least one selected from the group consisting of oxygen and nitrogen. The gas OT1 includes, for example, oxygen ions.

As shown in FIG. 9B, the second magnetic layer 12 and the first compound region 51 are formed from the second magnetic film 12F by the processing using the gas OT1. The first compound region 51 is positioned at the bottom portions TB1 of the multiple first holes H1. The first compound region 51 includes the second metal (the metal included in the second magnetic film 12F) and the first element (e.g., oxygen). The second magnetic layer 12 does not overlap the multiple first holes H1 in the first direction (the Z-axis direction). The second magnetic layer 12 includes the second metal.

As shown in FIG. 9B, a portion (e.g., the second region SR1, referring to FIG. 1B) of the first nonmagnetic film 11nF overlaps the second magnetic layer 12 in the second direction (the X-axis direction).

In the manufacturing method according to the embodiment, a portion of the second magnetic film 12F is deactivated. The remaining portion of the second magnetic film 12F that is not deactivated is used to form the second magnetic layer 12. In the process of deactivating (the processing using the gas OT1), the side portion of the second magnetic layer 12 is covered with a portion (e.g., the second region SR1) of the first nonmagnetic film 11nF. The penetration of excessive oxygen into the side portion of the second magnetic layer 12 is suppressed. The length along the X-axis direction of the effective portion of the second magnetic layer 12 is maintained at the desired length. The occurrence of damage due to oxygen of the side portion of the second magnetic layer 12 is suppressed.

The second compound region 52 may be formed at this time. For example, as shown in FIG. 9B, the conductive film 20F includes a bottom conductive region 20FB. The bottom conductive region 20FB is positioned at the bottom portions TB1 of the multiple first holes H1. The processing using the gas OT1 including the first element recited above (oxygen or nitrogen) may include forming the second compound region 52 from the bottom conductive region 20FB. The second compound region 52 includes the first element and at least one selected from the group consisting of the first metal and the "other element" recited above. For example, the second compound region 52 may overlap at least a portion of the second magnetic layer 12 in the second direction (the X-axis direction) (referring to FIG. 2B).

Figure 10:
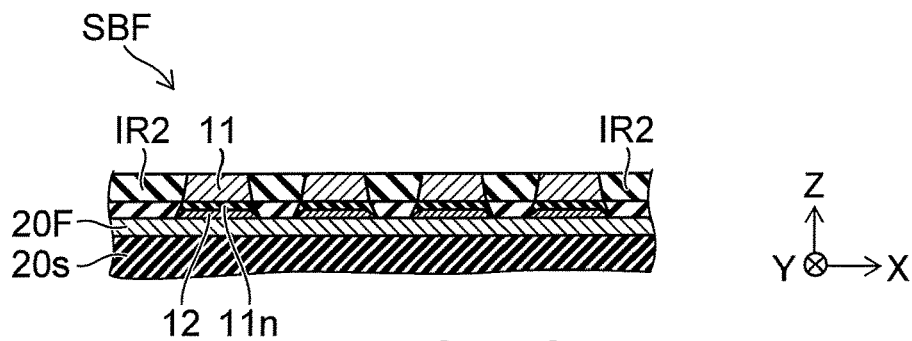
FIG. 10 is a schematic view illustrating the method for manufacturing the magnetic memory device according to the second embodiment.

As shown in FIG. 10, the second insulating region IR2 is formed on the first compound region 51 (step S160, referring to FIG. 6). The second insulating region IR2 includes, for example, at least one selected from the group consisting of Si and Al, and at least one selected from the group consisting of oxygen and nitrogen. For example, the second insulating region IR2 is formed by film formation using a method such as CVD, etc., and by performing CMP, etc.

Figure 11:
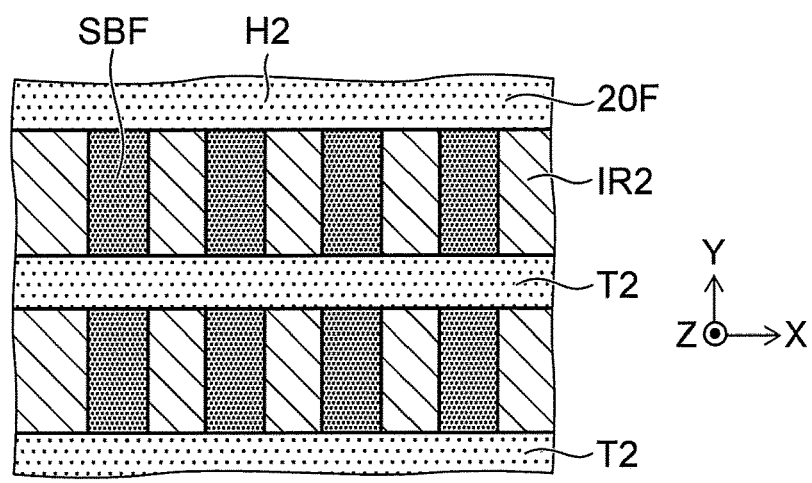
FIG. 11 is a schematic view illustrating the method for manufacturing the magnetic memory device according to the second embodiment.
Figure 12:
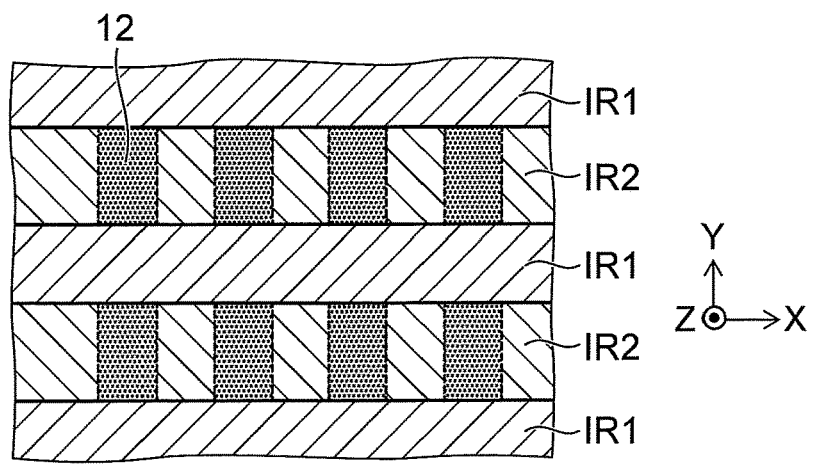
FIG. 12 is a schematic view illustrating the method for manufacturing the magnetic memory device according to the second embodiment.

As shown in FIG. 11, a second hole H2 is formed in the stacked film (step S120, referring to FIG. 6). As shown in FIG. 12, the first insulating region IR1 is formed inside the second hole H2 (step S130). The direction from the first insulating region IR1 toward the second magnetic layer 12 is aligned with the third direction a direction crossing a plane including the Y-axis direction, the first direction, and the second direction). The first insulating region IR1 includes at least one selected from the group consisting of Si and Al, and at least one selected from the group consisting of oxygen and nitrogen. At this time, the first nonmagnetic film 11nF includes Mg and at least one selected from the group consisting of oxygen and nitrogen.

For example, the material of a portion (the second region SR1) of the first nonmagnetic film 11nF and the material of the first insulating region IR1 are different from each other.

Figure 13:
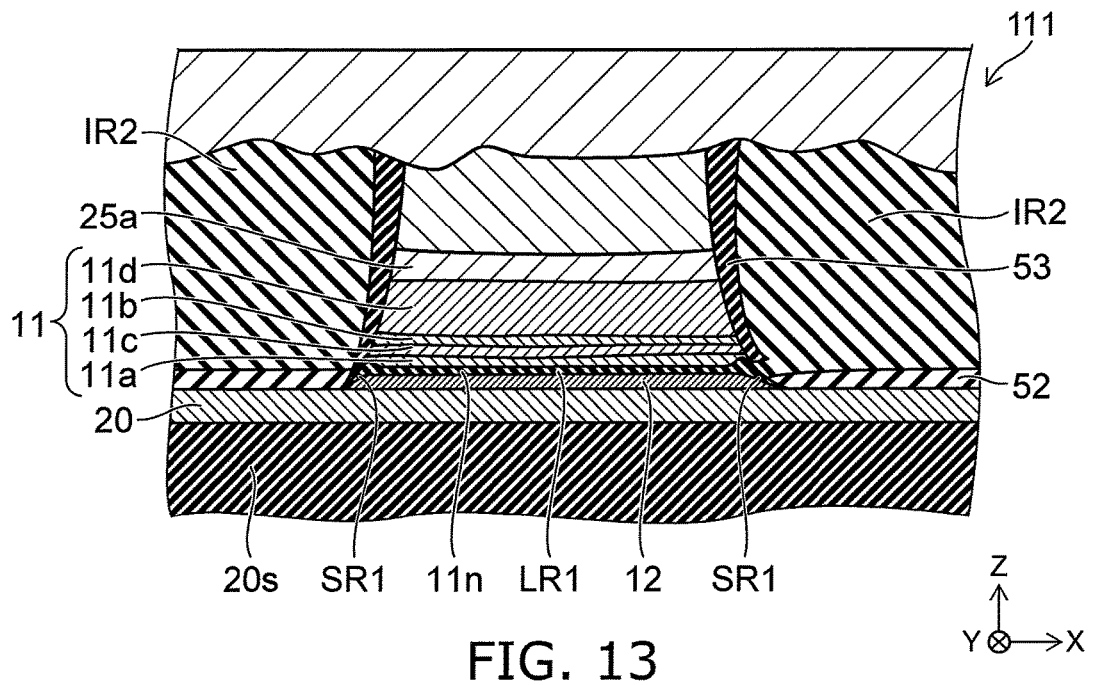
FIG. 13 is a schematic cross-sectional view illustrating another magnetic memory device according to the first embodiment.

FIG. 13 is a schematic cross-sectional view illustrating another magnetic memory device according to the first embodiment.

In the magnetic memory device 111 as shown in FIG. 13, the first compound region 51 is not provided; and the second compound region 52 and the third compound region 53 are provided. For example, the second insulating region IR2 contacts the second compound region 52.

Figure 14:
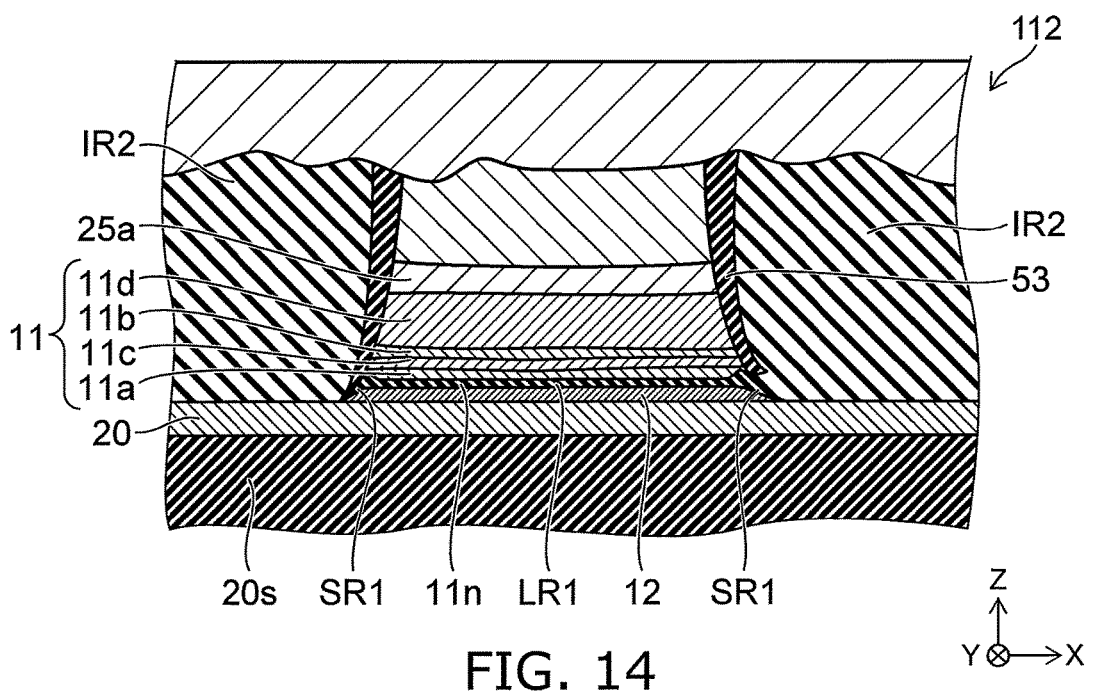
FIG. 14 is a schematic cross-sectional view illustrating another magnetic memory device according to the first embodiment.

FIG. 14 is a schematic cross-sectional view illustrating another magnetic memory device according to the first embodiment.

In the magnetic memory device 112 as shown in FIG. 14, the first compound region 51 and the second compound region 52 are not provided; and the third compound region 53 is provided. For example, the second insulating region IR2 contacts the conductive layer 20.

For example, the magnetic memory devices 111 and 112 are formed by removing the second magnetic film 12F in the processing using the gas OT1 (step S150, referring to FIG. 6). For example, the removal is performed by ion beam irradiation, etc.

For example, compared to the first compound region 51 and the second compound region 52, the second insulating region IR2 is stable in the heat treatment of subsequent processes. On the other hand, for example, the second magnetic layer 12 is protected by the second region SR1. In the magnetic memory devices 111 and 112, a more stable magnetic memory device is obtained.

Third Embodiment

Figure 15A:
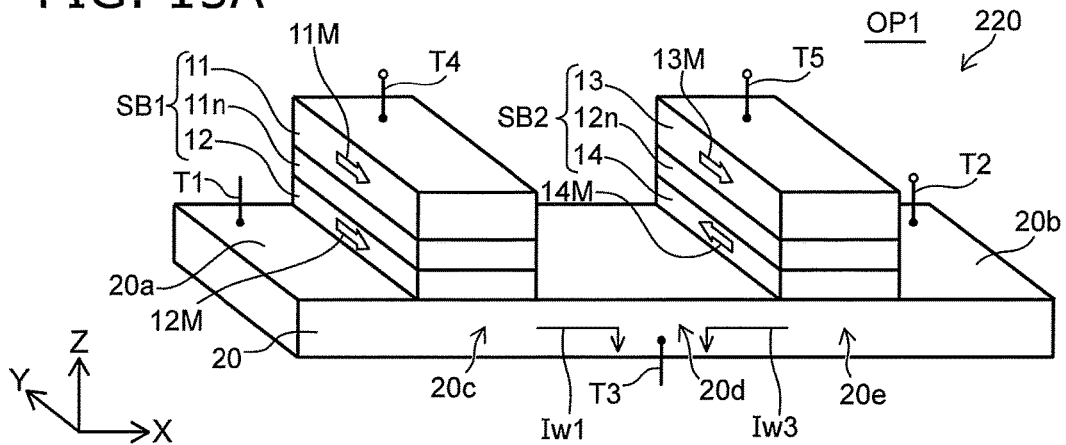
FIG. 15A to FIG. 15C are schematic perspective views illustrating a magnetic memory device according to a third embodiment.
Figure 15B:
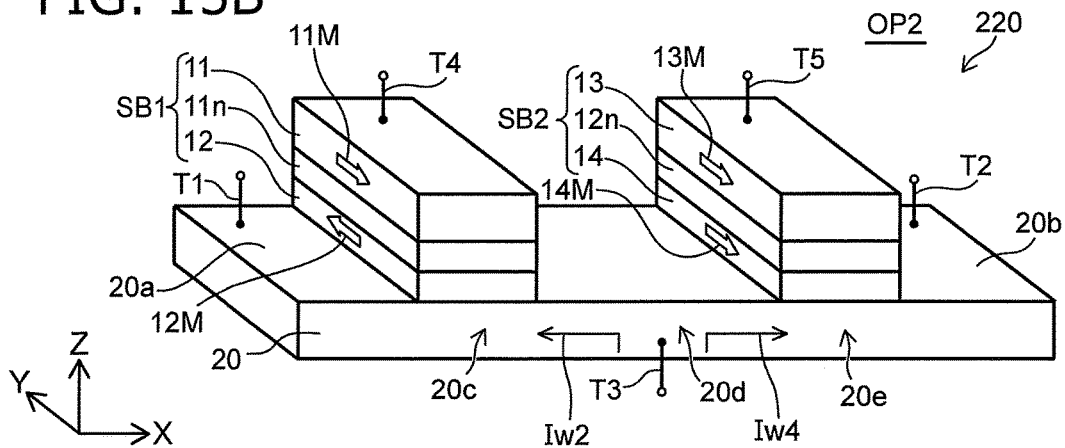
Figure 15C:
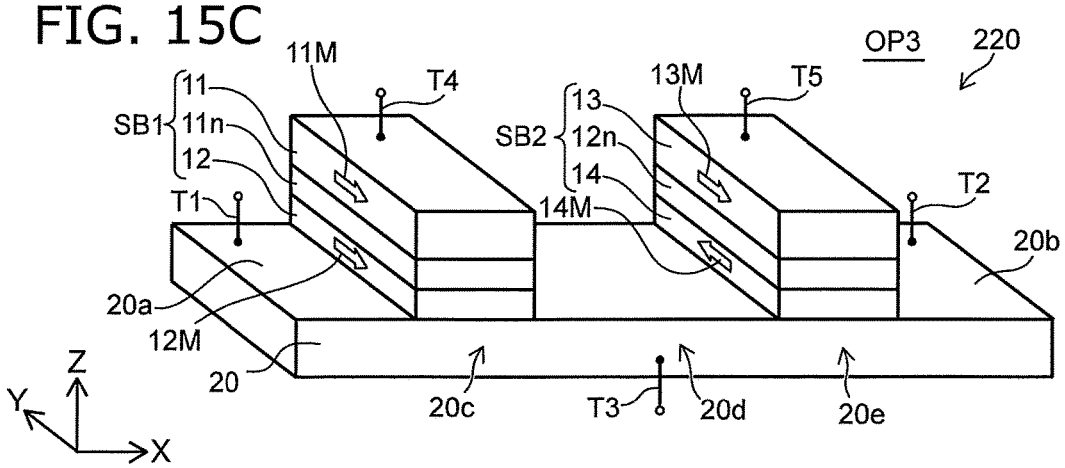

FIG. 15A to FIG. 15C are schematic perspective views illustrating a magnetic memory device according to a third embodiment.

As shown in FIG. 15A, the multiple stacked bodies (the first stacked body SB1 and the second stacked body SB2) are provided in the magnetic memory device 220 according to the embodiment as well. In the magnetic memory device 220, the current that flows in the first stacked body SB1 and the current that flows in the second stacked body SB2 are different from each other.

The first stacked body SB1 overlaps the third portion 20c in the first direction (the Z-axis direction). The second stacked body SB2 overlaps the fifth portion 20e in the first direction. The fourth portion 20d of the conductive layer 20 corresponds to the portion between the first stacked body SB1 and the second stacked body SB2.

For example, a first terminal T1 is electrically connected to the first portion 20a of the conductive layer 20. A second terminal T2 is electrically connected to the second portion 20b. A third terminal T3 is electrically connected to the fourth portion 20d. A fourth terminal T4 is electrically connected to the first magnetic layer 11. A fifth terminal T5 is electrically connected to the third magnetic layer 13.

In one operation OP1 as shown in FIG. 15A, the first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation OP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation OP2 shown in FIG. 15B, the second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation OP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 15A and FIG. 15B, the orientation of the fourth magnetization 14M of the fourth magnetic layer 14 is the reverse of the orientation of the second magnetization 12M of the second magnetic layer 12. On the other hand, the orientation of the third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation OP1 corresponds to "1." For example, the information (the data) of the case of the operation OP2 corresponds to "0." By such operations, for example, the reading can be faster as described below.

In the operation OP1 and the operation OP2, the second magnetization 12M of the second magnetic layer 12 and the spin current of the electrons (the polarized electrons) flowing through the conductive layer 20 have an interaction. The orientation of the second magnetization 12M and the orientation of the spin of the polarized electrons have a parallel or an antiparallel relationship. The second magnetization 12M of the second magnetic layer 12 precesses and reverses. In the operation OP1 and the operation OP2, the orientation of the fourth magnetization 14M of the fourth magnetic layer 14 and the orientation of the spin of the polarized electrons have a parallel or an antiparallel relationship. The fourth magnetization 14M of the fourth magnetic layer 14 precesses and reverses.

FIG. 15C illustrates a read operation of the magnetic memory device 220.

In the read operation OP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as $\Delta V$. Two electrical resistances of each of the multiple stacked bodies are taken as a high resistance Rh and a low resistance Rl. The high resistance Rh is higher than the low resistance Rl. For example, the resistance corresponds to the high resistance Rh when the first magnetization 11M and the second magnetization 12M are antiparallel. For example, the resistance corresponds to the low resistance Rl when the first magnetization 11M and the second magnetization 12M are parallel. For example, the resistance corresponds to the high resistance Rh when the third magnetization 13M and the fourth magnetization 14M are antiparallel. For example, the resistance corresponds to the low resistance Rl when the third magnetization 13M and the fourth magnetization 14M are parallel.

For example, in the operation OP1 (the "1" state) illustrated in FIG. 15A, a potential Vr1 of the third terminal T3 is represented by Formula (1).

$$Vr1 = (Rl/(Rl+Rh)) \times \Delta V \tag{1}$$

On the other hand, a potential Vr2 of the third terminal T3 in the state of the operation OP2 (the "0" state) illustrated in FIG. 15B is represented by Formula (2).

$$Vr2 = (Rh/(Rl+Rh)) \times \Delta V \tag{2}$$

Accordingly, the potential change $\Delta Vr$ between the "1" state and the "0" state is represented by Formula (3).

$$\Delta Vr = Vr2 - Vr1 = ((Rh-Rl)/(Rl+Rh)) \times \Delta V \tag{3}$$

The potential change $\Delta Vr$ is obtained by measuring the potential of the third terminal T3.

For example, the consumed energy when reading in the read operation OP3 recited above can be reduced compared to the case where a constant current is supplied to the stacked body (the magnetoresistive element) and the voltage (the potential difference) is measured between the two magnetic layers of the magnetoresistive element. In the read operation OP3 recited above, for example, high-speed reading can be performed.

In the operation OP1 and the operation OP2 recited above, the perpendicular magnetic anisotropies of the second magnetic layer 12 and the fourth magnetic layer 14 can be controlled by using the fourth terminal T4 and the fifth terminal T5. Thereby, the program current can be reduced. For example, the program current can be about ½ of the program current in the case where the programming is performed without using the fourth terminal T4 and the fifth terminal T5. For example, the program charge can be reduced. The relationship between the increase or decrease of the perpendicular magnetic anisotropy and the polarity of the voltage applied to the fourth terminal T4 and the fifth terminal T5 is dependent on the materials of the magnetic layers and the conductive layer 20.

Figure 16A:
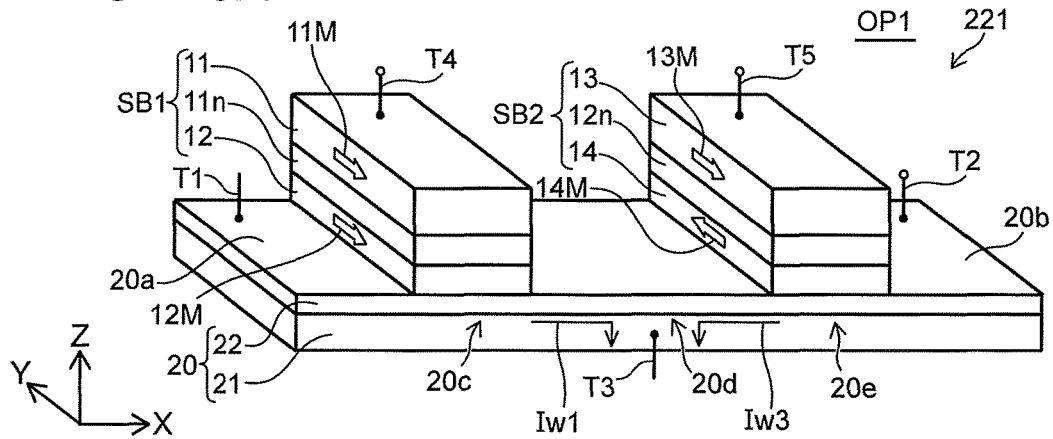
FIG. 16A to FIG. 16C are schematic perspective views illustrating another magnetic memory device according to the third embodiment.
Figure 16B:
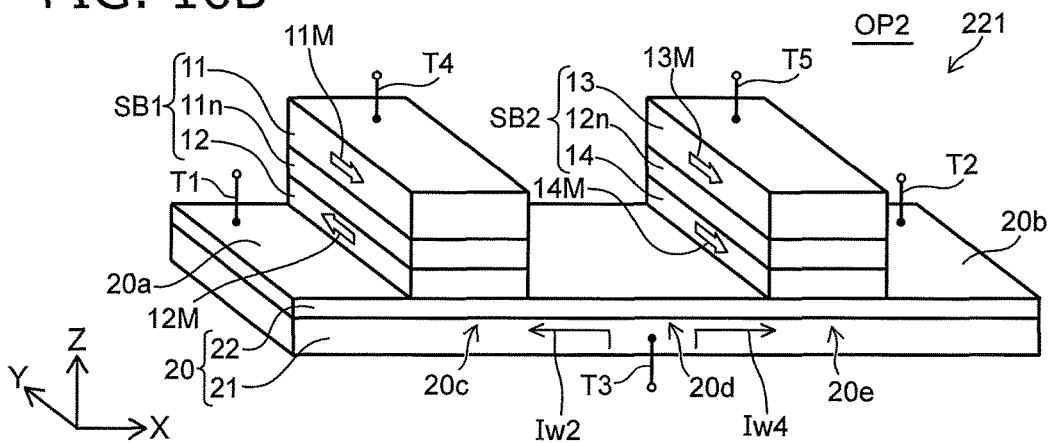
Figure 16C:
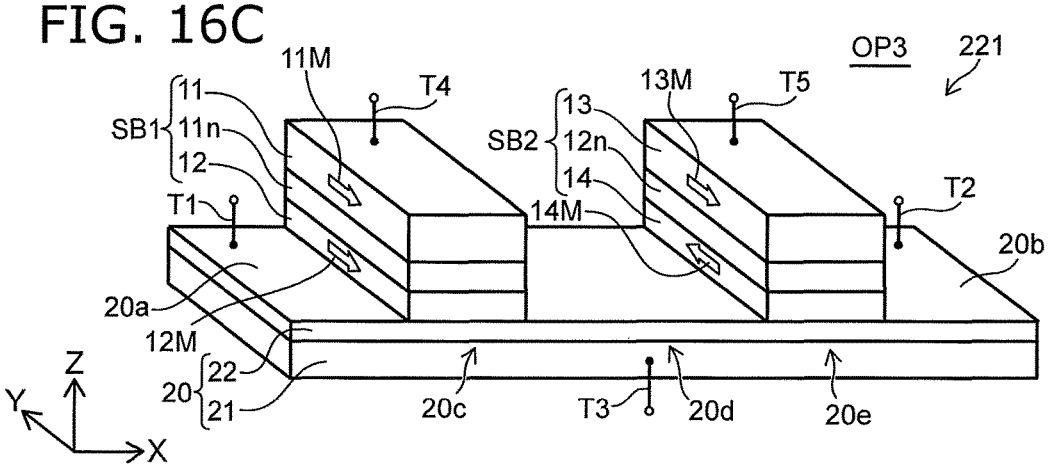

FIG. 16A to FIG. 16C are schematic perspective views illustrating another magnetic memory device according to the third embodiment.

In the magnetic memory device 221 according to the embodiment as shown in FIG. 16A to FIG. 16C, a first conductive region 21 and a second conductive region 22 are provided in the conductive layer 20. Otherwise, the configuration of the magnetic memory device 221 is similar to the magnetic memory device 220.

In FIG. 15C recited above, the first terminal T1 and the second terminal T2 may be set to the same potential; the fourth terminal T4 and the fifth terminal T5 may be connected to the input terminals of a sense amplifier; and the potential difference between the fourth terminal T4 and the fifth terminal T5 may be read by the sense amplifier. A voltage may be applied to one of the first terminal T1 or the second terminal T2; and the other of the first terminal T1 or the second terminal T2 may be floating. Or, the current difference between the fourth terminal T4 and the fifth terminal T5 may be read by causing the same current to flow in the first terminal T1 and the second terminal T2. The first terminal T1 and the second terminal T2 may be set to the same potential; the fourth terminal T4 and the fifth terminal T5 may be connected to the input terminals of a sense amplifier; and the potential difference between the fourth terminal T4 and the fifth terminal T5 may be read by the sense amplifier. The fourth terminal T4 and the fifth terminal T5 may be set to the same potential; the first terminal T1 and the second terminal T2 may be connected to the input terminals of a sense amplifier; and the potential difference between the first terminal T1 and the second terminal T2 may be read by the sense amplifier.

According to the embodiments, a magnetic memory device and a method for manufacturing the magnetic memory device can be provided in which the storage density can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies so that a state is formable in which a current flows between the multiple conductive bodies.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory device such as the conductive layer, the magnetic layer, the nonmagnetic layer, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All magnetic memory devices and methods for manufacturing the magnetic memory devices practicable by an appropriate design modification by one skilled in the art based on the magnetic memory devices and the methods for manufacturing the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a conductive layer including a first portion, a second portion, and a third portion between the first portion and the second portion, the conductive layer including a first metal;
    a first magnetic layer separated from the third portion in a first direction crossing a second direction, the second direction being from the first portion toward the second portion;
    a second magnetic layer provided between the first magnetic layer and at least a portion of the third portion;
    a first nonmagnetic layer including a first region and a second region, the first region being provided between the first magnetic layer and the second magnetic layer, the second region being continuous with the first region, the second region overlapping at least a portion of the second magnetic layer in the second direction; and
    a controller electrically connected to the first portion and the second portion, the controller being configured to supply a current to the conductive layer, wherein:
the second region includes a first partial region and a second partial region,
a distance along the first direction between the first partial region and the third portion is shorter than a distance along the first direction between the second partial region and the third portion, and
a length along the second direction of the first partial region is shorter than a length along the second direction of the second partial region.

2. The device according to claim 1, wherein the second region is seamless with the first region.

3. The device according to claim 1, further comprising a first compound region,
the second magnetic layer including a second metal including at least one selected from the group consisting of Fe, Co, and Ni,
the first compound region including the second metal and at least one selected from the group consisting of oxygen and nitrogen,
at least a portion of the second region being positioned between the first compound region and the at least a portion of the second magnetic layer in the second direction.

4. The device according to claim 1, further comprising a second compound region,
the conductive layer further including another element including at least one selected from the group consisting of B, Mg, Al, Si, Hf, Ti, and Zr,
the second compound region including at least one selected from the group consisting of oxygen and nitrogen, and at least one selected from the group consisting of the first metal and the other element,
at least a portion of the second region being positioned between the second compound region and the at least a portion of the second magnetic layer in the second direction.

5. The device according to claim 1, wherein the second region contacts the at least a portion of the second magnetic layer.

6. The device according to claim 1, wherein
the first region has a first surface opposing the first magnetic layer, and
the first surface is concave.

7. The device according to claim 1, wherein the second region does not overlap the first magnetic layer in the second direction.

8. The device according to claim 1, wherein the first metal includes at least one selected from the group consisting of Ta, W, Re, Os, Ir, Pt, Pd, Cu, and Ag.

9. The device according to claim 1, wherein
the controller implements:
a first program operation of supplying a first program current to the conductive layer from the first portion toward the second portion; and
a second program operation of supplying a second program current to the conductive layer from the second portion toward the first portion,
a first electrical resistance between the first magnetic layer and the first portion after the first program operation being different from a second electrical resistance between the first magnetic layer and the first portion after the second program operation.

10. The device according to claim 1, wherein a thickness along the second direction of at least a portion of the second region is 0.5 nm or more.

11. A magnetic memory device, comprising:
a conductive layer including a first portion, a second portion, and a third portion between the first portion and the second portion, the conductive layer including a first metal;
a first magnetic layer separated from the third portion in a first direction crossing a second direction, the second direction being from the first portion toward the second portion;
a second magnetic layer provided between the first magnetic layer and at least a portion of the third portion;
a first nonmagnetic layer including a first region and a second region, the first region being provided between the first magnetic layer and the second magnetic layer, the second region being continuous with the first region, the second region overlapping at least a portion of the second magnetic layer in the second direction; and
a controller electrically connected to the first portion and the second portion, the controller being configured to supply a current to the conductive layer, wherein
the first region has a first surface opposing the first magnetic layer,
the first surface includes a first surface portion, a second surface portion, and a third surface portion,
a direction from the first surface portion toward the second surface portion is aligned with the second direction,
a position in the second direction of the third surface portion is between a position in the second direction of the first surface portion and a position in the second direction of the second surface portion, and
a distance along the first direction between the third surface portion and the third portion is shorter than a distance along the first direction between the first surface portion and the third portion.

12. The device according to claim 1, wherein the first nonmagnetic layer includes at least one selected from the group consisting of Mg and Al, and at least one selected from the group consisting of oxygen and nitrogen.

13. The device according to claim 12, further comprising a first insulating region,
a direction toward the second magnetic layer from the first insulating region being aligned with a third direction crossing a plane including the first direction and the second direction,
the first insulating region including at least one selected from the group consisting of Si and Al, and at least one selected from the group consisting of oxygen and nitrogen.

14. The device according to claim 13, further comprising a second insulating region,
a direction from the second insulating region toward at least a portion of the first magnetic layer being aligned with the second direction,
the second insulating region including at least one selected from the group consisting of Si and Al, and at least one selected from the group consisting of oxygen and nitrogen.

15. A magnetic memory device, comprising:
a conductive layer including a first portion, a second portion, and a third portion between the first portion and the second portion, the conductive layer including a first metal;
a first magnetic layer separated from the third portion in a first direction crossing a second direction, the second direction being from the first portion toward the second portion;

a second magnetic layer provided between the first magnetic layer and at least a portion of the third portion;
a first nonmagnetic layer including a first region provided between the first magnetic layer and the second magnetic layer;
a second region overlapping at least a portion of the second magnetic layer in the second direction;
a first insulating region, a direction from the first insulating region toward the second magnetic layer being aligned with a third direction crossing a plane including the first direction and the second direction; and
a controller electrically connected to the first portion and the second portion, the controller being configured to supply a current to the conductive layer,
an absolute value of a difference between a linear expansion coefficient of the second region and a linear expansion coefficient of the second magnetic layer being less than an absolute value of a difference between a linear expansion coefficient of the first insulating region and the linear expansion coefficient of the second magnetic layer.

* * * * *